(12) United States Patent
Miks et al.

(10) Patent No.: US 7,011,251 B1
(45) Date of Patent: *Mar. 14, 2006

(54) DIE DOWN MULTI-MEDIA CARD AND METHOD OF MAKING SAME

(75) Inventors: Jeffrey Alan Miks, Chandler, AZ (US); John A. Miranda, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/109,329

(22) Filed: Apr. 19, 2005

Related U.S. Application Data (63) Continuation of application No. 10/266,329, filed on Oct. 8, 2002, now Pat. No. 6,910,635.

(51) Int. Cl.
*G06K 19/00* (2006.01)

(52) U.S. Cl. ............................ 235/487; 235/488
(58) Field of Classification Search ................ 235/487, 235/488, 492
See application file for complete search history.

(56) References Cited

U.S. PATENT DOCUMENTS

| | | |
|---|---|---|
| 3,668,299 A | 6/1972 | Mc Neal |
| 4,532,419 A | 7/1985 | Takeda |
| 4,905,124 A | 2/1990 | Banjo et al. |
| 4,974,120 A | 11/1990 | Kodai et al. |
| 5,172,214 A | 12/1992 | Casto |
| 5,360,992 A | 11/1994 | Lowrey et al. |
| 5,574,309 A | 11/1996 | Papapietro et al. |
| 5,742,479 A | 4/1998 | Asakura |
| 5,753,532 A | 5/1998 | Sim |
| 5,784,259 A | 7/1998 | Asakura |
| 5,789,280 A | 8/1998 | Yokota et al. |
| 5,808,359 A | 9/1998 | Muto et al. |
| 5,822,190 A | 10/1998 | Iwasaki |
| 5,893,724 A | 4/1999 | Chakravorty et al. |
| 5,977,613 A | 11/1999 | Takata et al. |
| 6,040,622 A | 3/2000 | Wallace |

(Continued)

FOREIGN PATENT DOCUMENTS

JP 3112688 5/1991

(Continued)

*Primary Examiner*—Karl D. Frech
(74) *Attorney, Agent, or Firm*—Stetina Brunda Garred & Brucker (57) ABSTRACT

A circuit module comprising a leadframe having at least one die pad, a plurality of contacts, and a plurality of conductive traces extending from respective ones of the contacts toward the die pad. The traces are bent in a manner wherein the die pad and the contacts extend along respective ones of spaced, generally parallel frame planes. Attached to the die pad is a semiconductor die which extends along a die plane disposed between and generally parallel to the frame planes. The semiconductor die is electrically connected to at least one of the traces. A body at least partially encapsulates the leadframe and the semiconductor die such that the die pad is exposed within a top surface defined by the body and the contacts are exposed within a bottom surface defined by the body.

20 Claims, 4 Drawing Sheets

U.S. PATENT DOCUMENTS

| | | |
|---|---|---|
| 6,143,981 A | 11/2000 | Glenn |
| D445,096 S | 7/2001 | Wallace |
| D446,525 S | 8/2001 | Okamoto et al. |
| 6,376,283 B1 | 4/2002 | Chen |
| 6,384,472 B1 | 5/2002 | Huang |
| 6,462,273 B1 | 10/2002 | Corisis et al. |
| 6,476,469 B1 | 11/2002 | Hung et al. |
| 6,545,332 B1 | 4/2003 | Huang |
| 6,603,196 B1 | 8/2003 | Lee et al. |
| 6,624,005 B1 | 9/2003 | Di Caprio et al. |
| 6,910,635 B1 * | 6/2005 | Miks et al. ................. 235/487 |
| 2002/0140068 A1 | 10/2002 | Lee |

FOREIGN PATENT DOCUMENTS

| | | |
|---|---|---|
| JP | 7017175 | 1/1995 |
| JP | 8190615 | 7/1996 |
| JP | 10334205 | 12/1998 |
| KR | 199410938 | 5/1994 |
| KR | 199552621 | 12/1995 |

* cited by examiner

DIE DOWN MULTI-MEDIA CARD AND METHOD OF MAKING SAME

CROSS-REFERENCE TO RELATED APPLICATIONS

The present application is a continuation of U.S. patent application Ser. No. 10/266,329 entitled DIE DOWN MULTI-MEDIA CARD AND METHOD OF MAKING SAME filed Oct. 8, 2002, now U.S. Pat. No. 6,910,635.

STATEMENT RE: FEDERALLY SPONSORED RESEARCH/DEVELOPMENT (Not Applicable)

BACKGROUND OF THE INVENTION

The present invention relates generally to circuit modules and, more particularly, to a memory card (e.g., a multi-media card (MMC)) comprising a leadframe implanted into a plastic body such that a semiconductor die is mounted in a downward configuration with respect to the connector of the card.

As is well known in the electronics industry, circuit modules or cards are being used in increasing numbers to provide memory storage and other electronic functions for devices such as digital cameras, MP3 players, cellular phones, and personal digital assistants. In this regard, circuit modules are currently used in various memory card formats, including multi-media cards and secure digital cards.

Typically, circuit modules include multiple integrated circuit devices or semiconductor dies. The dies are interconnected using a circuit board substrate which adds to the weight, thickness, stiffness and complexity of the module. Circuit modules also include electrical contacts for providing an external interface to an insertion point or socket. These electrical contacts are typically disposed on the back side of the circuit board substrate, with the electrical connection to the dies being provided by vias which extend through the circuit board substrate.

In an effort to simplify the process steps needed to fabricate the circuit module and, hence, the memory card using the same, there has been developed by Applicant a circuit module wherein a leadframe assembly is used as an alternative to the circuit board substrate, as described in Applicant's co-pending U.S. application Ser. No. 09/956,190 entitled LEAD-FRAME METHOD AND ASSEMBLY FOR INTERCONNECTING CIRCUITS WITHIN A CIRCUIT MODULE filed Sep. 19, 2001, the disclosure of which is incorporated herein by reference. As is described in Ser. No. 09/956,190, the leadframe and semiconductor die of the circuit module may be covered with an encapsulant which hardens into a cover or body. The body is sized and configured to meet or achieve a "form factor" associated with the memory card. In the completed memory card, the contacts of the leadframe are exposed within a common surface of the body, with a die pad of the leadframe and the semiconductor die mounted thereto being disposed within or covered by the body.

It has been found that the molding or encapsulation process sometimes gives rise to structural deficiencies or problems within the resultant memory card. These problems include portions of the die pad of the leadframe being exposed within the memory card, flash being disposed on the contacts of the leadframe, chipping in a peripheral flange area of the body, and mold gate pull-out wherein a portion of the mold or encapsulating compound is pulled out from within the body leaving a small recess or void therein. The present invention addresses these problems by providing a memory card having a "die down" configuration attributable to the structural attributes of the leadframe included therein, and an associated molding methodology employed in the fabrication of such memory card. These, as well as other features and attributes of the present invention, will be discussed in more detail below.

BRIEF SUMMARY OF THE INVENTION

In accordance with the present invention, there is provided a circuit module comprising a leadframe having at least one die pad, a plurality of contacts, and a plurality of conductive traces extending from respective ones of the contacts toward the die pad. The traces are bent in a manner wherein the die pad and the contacts extend along respective ones of spaced, generally parallel frame planes. Attached to the die pad is a semiconductor die which extends along a die plane disposed between and generally parallel to the frame planes. The semiconductor die is electrically connected to at least one of the traces. A body at least partially encapsulates the leadframe and the semiconductor die such that the die pad is exposed within a top surface defined by the body and the contacts are exposed within a bottom surface defined by the body.

A memory card constructed in accordance with the present invention may be assembled by attaching a lid or skin to the above-described circuit module. The presentation of the semiconductor die of the circuit module in a die down configuration eliminates various drawbacks associated with current memory card manufacturing methodologies and, most notably, unwanted exposure of the die pad within the memory card. In an alternative embodiment of the present invention, the body may be formed in a manner eliminating the need to include a separate lid or skin. In this regard, the body is formed having a shape which satisfies any one of various form factor requirements for a memory card format. The body of the circuit module or memory card may be formed via an injection molding technique, reaction injection molding, resin transfer molding, or infusion molding through the use of a dedicated mold having a circuit module placed therein. The use of such dedicated mold also alleviates various problems currently encountered with memory card manufacturing processes, including chipping within the body and mold gate pull-out.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figures 1, 2:
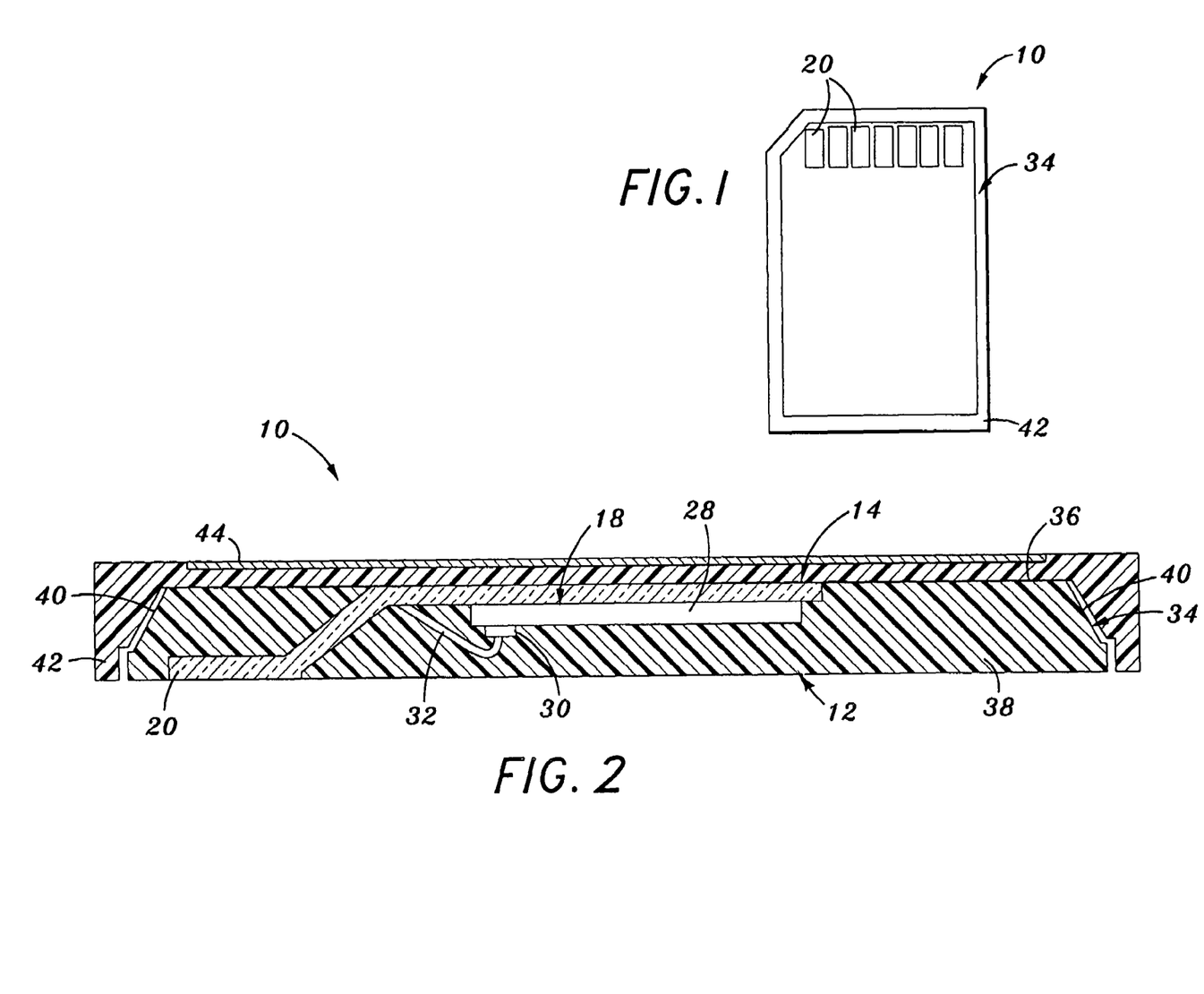
FIG. 1 is a bottom plan view of a memory card which is constructed in accordance with a first embodiment of the present invention and has a multi-media card form factor.
FIG. 2 is a cross-sectional view taken along line 2—2 of FIG. 1.

Referring now to the drawings wherein the showings are for purposes of illustrating preferred embodiments of the present invention only, and not for purposes of limiting the same, FIGS. 1 and 2 depict a memory card 10 constructed in accordance with a first embodiment of the present invention. The memory card 10 includes a circuit module 12. The circuit module 12 itself includes a leadframe 14 which is shown in a preliminary, unbent state in FIG. 3 and in its final, bent state in FIG. 2. The particular structural attributes of the leadframe 14 will be described below. As shown in FIGS. 1 and 2, the memory card 10 including the circuit module 12 has a form factor particularly suited for use in a multi-media card memory application. However, those of ordinary skill in the art will recognize that the circuit module 12 of the present invention may also be used in alternative memory card formats including secure digital cards (SDC), compact flash (CF), memory stick, and other small form factor memory cards. The circuit module 12 may further be used in peripheral device cards such as I/O cards. The particular structural attributes of a secure digital card including the circuit module 12 of the present invention will also be described below.

Figure 3:
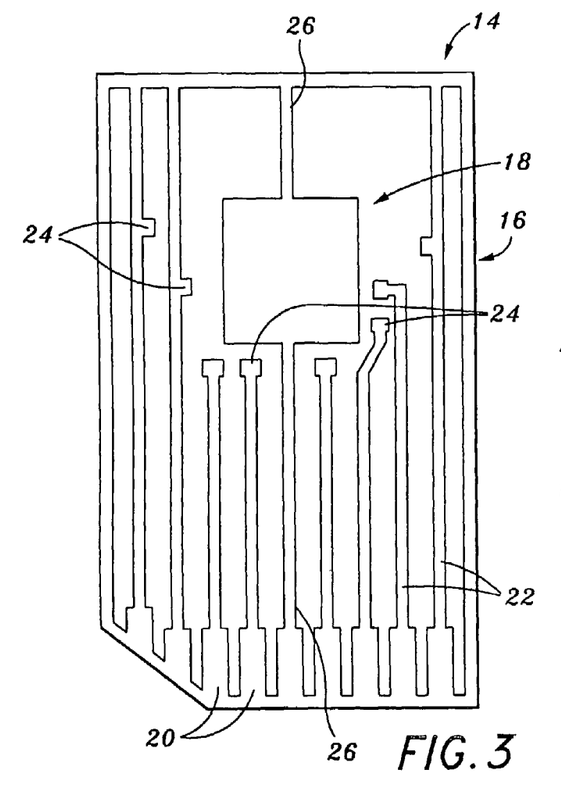
FIG. 3 is a top plan view of the leadframe included in the memory card of the first embodiment in a preliminary, unbent state.

In its preliminary, unbent state, the leadframe 14 of the circuit module 12 comprises an outer frame or dambar 16. The dambar 16 has a generally rectangular configuration defining an opposed pair of longitudinal sides or segments and an opposed pair of lateral sides or segments. The dambar 16 further defines a fifth sloped side which extends angularly between one of the lateral sides and one of the longitudinal sides thereof.

In addition to the dambar 16, the leadframe 14 includes at least one die attach area such as a die pad 18 which is disposed within the interior of the dambar 16. The die pad 18 defines opposed, generally planar top and bottom surfaces. Integrally connected to and extending inwardly from the sloped side of the dambar 16 and corresponding lateral side thereof are a plurality of contacts 20 of the leadframe 14. Each of the contacts 20 also defines opposed, generally planar top and bottom surfaces. Integrally connected to and extending from each of the contacts 20 is an elongate conductive trace 22. As seen in FIG. 3, certain ones of the traces 22 extend and are integrally connected to the lateral side of the dambar 16 opposite that including the contacts 20 formed thereon. The remaining traces 22 terminate in close proximity to respective ones of the peripheral sides or edges of the die pad 18. Integrally formed on each of the traces 22 is a bond pad 24. As further seen in FIG. 3, the bond pads 24 are each located in close proximity to respective ones of the peripheral sides of the die pad 18. For those traces 22 which are not integrally connected to one lateral side of the dambar 16, the bond pads 24 are formed at the distal ends thereof, i.e., those ends opposite the ends integrally connected to the contacts 20.

The leadframe 14 of the circuit module 12 is preferably fabricated from a conductive metal material (e.g., copper) through either a chemical etching or mechanical stamping process. It is contemplated that the die pad 18, contacts 20, and/or traces 22 of the leadframe 14 may be formed to have a thickness less than that of the surrounding dambar 16 by subjecting one or both sides of the formed leadframe 14 to a partial etching process. In the leadframe 14, the die pad 18 is supported within the interior of the dambar 16 by one or more tie bars 26. As shown in FIG. 3, one tie bar 26 is integrally connected to and extends between the die pad 18 and one lateral side of the dambar 16. A second tie bar 26 is integrally connected to and extends between the die pad 18 and one of the contacts 20. Those of ordinary skill in the art will recognize that the leadframe 14 may be formed to include only one of the two tie bars 26 shown in FIG. 3. Additionally, one or both of such tie bars 26 may also be subjected to the above-described partial etch for purposes of reducing the thickness thereof as compared to the dambar 16.

In addition to the leadframe 14, the circuit module 12 comprises a semiconductor die 28. Included on the top surface of the semiconductor die 28 are a plurality of terminals 30. In the circuit module 12, the bottom surface of the semiconductor die 28 (i.e., the surface opposite that including the terminals 30) is attached to the bottom surface of the die pad 18. Such attachment is preferably facilitated through the use of an epoxy or adhesive. Subsequent to such attachment, the terminals 30 of the semiconductor die 28 are electrically connected to respective ones of the bond pads 24 of the leadframe 14 via conductive wires 32. In this regard, the conductive wires 32 effectively place the terminals 30 into electrical communication with the leadframe 14 and, more particularly, respective ones of the contacts 20 thereof.

Subsequent to the electrical connection of the semiconductor die 28 to the leadframe 14 in the above-described manner, the leadframe 14 is subjected to a bending operation wherein each of the traces 22 is bent so as to facilitate the creation of an angled or sloped portion therein which is located between the contacts 20 and die pad 18 as shown in FIG. 2. The bending of the traces 20 removes the contacts 20 from their original co-planar relationship to the die pad 18. Thus, the contacts 20 and die pad 18 extend along spaced, generally parallel planes as further shown in FIG. 2. The bending of the leadframe 14 in the above-described manner may occur either prior to the attachment of the semiconductor die 28 to the die pad 18, or subsequent to the extension of the conductive wires 32 between the terminals 30 and bond pads 24.

Subsequent to the bending of the leadframe 14, an encapsulant material is applied to the leadframe 14, semiconductor die 28, and conductive wires 32. The encapsulant material is preferably a plastic (e.g., thermoset, thermoplastic) which, upon hardening, forms a body 34 of the circuit module 12. The completely formed body 34 defines a generally planar top surface 36, an opposed, generally planar bottom surface 38, and angled or sloped side surfaces 40. In the circuit module 12, the package body 34 is preferably formed such that the bottom surfaces of the contacts 20 are exposed within and generally flush with the bottom surface 38 of the body 34. The body 34 is also formed such that the top surface of the die pad 18 (i.e., the surface opposite that including the semiconductor die 28 attached thereto) is exposed within and flush with the top surface 36 of the body 34. However, the top surface of the die pad 18 may optionally be covered with a thin layer of the encapsulant material, and thus completely covered by and disposed within the body 34. Subsequent to the formation of the body 34, the leadframe 14 is cut or singulated in a manner facilitating the removal of the dambar 16 as is needed to electrically isolate the traces 22 and hence the contacts 20 from each other. In this regard, the body 34 is preferably formed on the leadframe 14 such that the dambar 16 remains exposed (i.e., is not covered by the body 34). The exposure of the dambar 16 allows for the removal of the same from the completely formed body 34.

The formation of the body 34 completes the fabrication of the circuit module 12 which includes the leadframe 14, semiconductor die 28, conductive wires 32, and body 34. In the completed circuit module 12, the semiconductor die 28 is in a "die down" configuration. More particularly, the semiconductor die 28 is directed downwardly within the circuit module 12 since it is located between the bottom surface of the die pad 18 and the bottom surface 38 of the body 34. As indicated above, the bottom surfaces of the contacts 20 are exposed within the bottom surface 38 of the body 34, and define the connector of the memory card 10. As seen in FIG. 1, the bottom surfaces of seven contacts 20 are exposed within the body 34.

Though the leadframe 14 shown in FIG. 3 includes a total of nine contacts 20, those of ordinary skill in the art will recognize that the leadframe 14 may be formed to include any number of contacts 20 (e.g., the seven contacts 20 shown in FIG. 1) depending on the desired application for the memory card 10. Along these lines, the leadframe 14 shown in FIG. 3 may further be alternatively configured to define two or more die pads for accommodating additional semiconductor dies or other devices. Further, more than one semiconductor die or other device could be attached to a single die pad. Thus, the configuration of the leadframe 14 as shown in FIG. 3 is exemplary only, in that the number of die pads, contacts, conductive traces (and hence bond pads) may be varied as needed to satisfy the requirements of a particular application. The only commonality in such leadframes is that a sufficient distance is defined between the die pad disposed closest to the contacts and the contacts themselves so as to provide sufficient space for the completion of the above-described bending procedure in relation to the conductive traces.

Figure 3A:
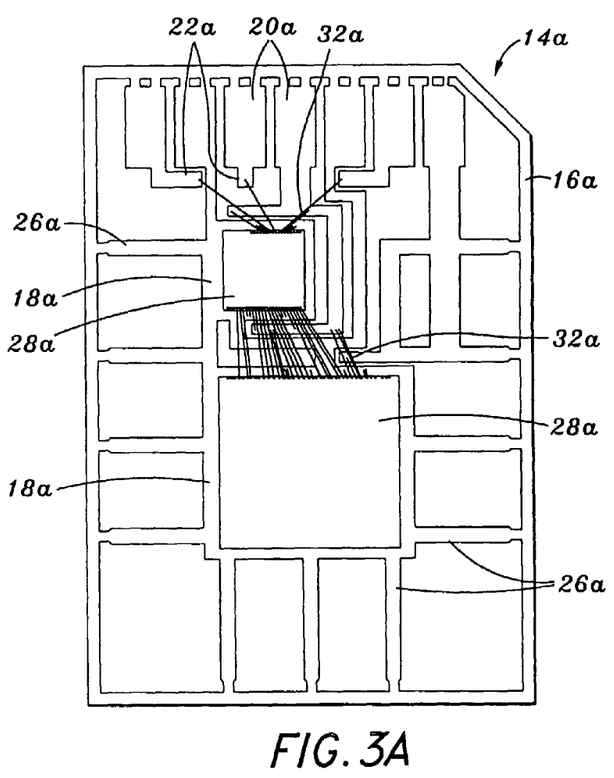
FIG. 3A is a top plan view of a leadframe in a preliminary, unbent state which may be included in the memory card of the first embodiment as an alternative to the leadframe shown in FIG. 3.

An exemplary leadframe 14a which may be employed in the circuit module 12 as an alternative to the leadframe 14 is shown in FIG. 3A. In its preliminary, unbent state, the leadframe 14a comprises an outer frame or dambar 16a. The dambar 16a has a generally rectangular configuration defining an opposed pair of longitudinal sides or segments and an opposed pair of lateral sides or segments. The dambar 16a further defines a fifth sloped side which extends angularly between one of the lateral sides and one of the longitudinal sides thereof.

In addition to the dambar 16a, the leadframe 14a includes a pair of die attach areas or die pads 18a which are disposed within the interior of the dambar 16a. The die pads 18a each define opposed, generally planar top and bottom surfaces. Integrally connected to and extending from one lateral side of the dambar 16a is a plurality of contacts 20a of the leadframe 14a. Each of the contacts 20a also defines opposed, generally planar top and bottom surfaces. Integrally connected to and extending from each of the contacts 20a is a conductive trace 22a. The traces 22a terminate in close proximity to respective ones of the die pads 18a. Tie bars 26a are used to integrally connect the die pads 18a to one or more of the longitudinal and lateral sides of the dambar 16a. The leadframe 14a is also preferably fabricated from a conductive metal material (e.g., copper) through either a chemical etching or mechanical stamping process. FIG. 3A further depicts a pair of semiconductor dies 28a attached to the bottom surfaces of respective ones of the die pads 18a. Also shown in FIG. 3A are the conductive wires 32a used to facilitate desired patterns of electrical contact between the semiconductor dies 28a and the leadframe 14a.

In addition to the completed circuit module 12, the memory card 10 of the present invention comprises a lid or skin 42. The skin 42 is attached to the body 34 of the circuit module 12 in the manner shown in FIG. 2. The skin 42 is formed to include angled surfaces, the slopes of which are complementary to the side surfaces 40 of the body 34, thus achieving a mating engagement therebetween. The attachment of the skin 42 to the circuit module 12 is preferably accomplished through the use of an adhesive. The attachment of the skin 42 to the circuit module 12 imparts to the completed memory card 10 a desired or prescribed form factor. When the skin 42 is attached to the circuit module 12, the top surface 36 of the body 34 is completely covered or shielded by the skin 42. Thus, due to the orientation of the semiconductor die 28 in the above-described die down configuration, the exposure of the top surface of the die pad 18 within the top surface 36 of the body 34 is of no consequence since such exposed top surface of the die pad 18 is also covered by the skin 42. Thus, the orientation of the semiconductor die 28 in the die down configuration effectively eliminates the above-described problems related to the exposure of portions of the die pad within the memory card. As further seen in FIG. 2, a label 44 may optionally be applied to the exposed top surface of the skin 42. In the completed memory card 10, any flash on the exposed bottom surfaces of the contacts 20 is preferably removed through the implementation of a de-flash technique (e.g., chemical, laser, electrolytic). The use of a dedicated mold to facilitate the formation of the body 34 eliminates the additional problems described above regarding chipping within the body 34 and mold gate pull-out.

Figure 4:
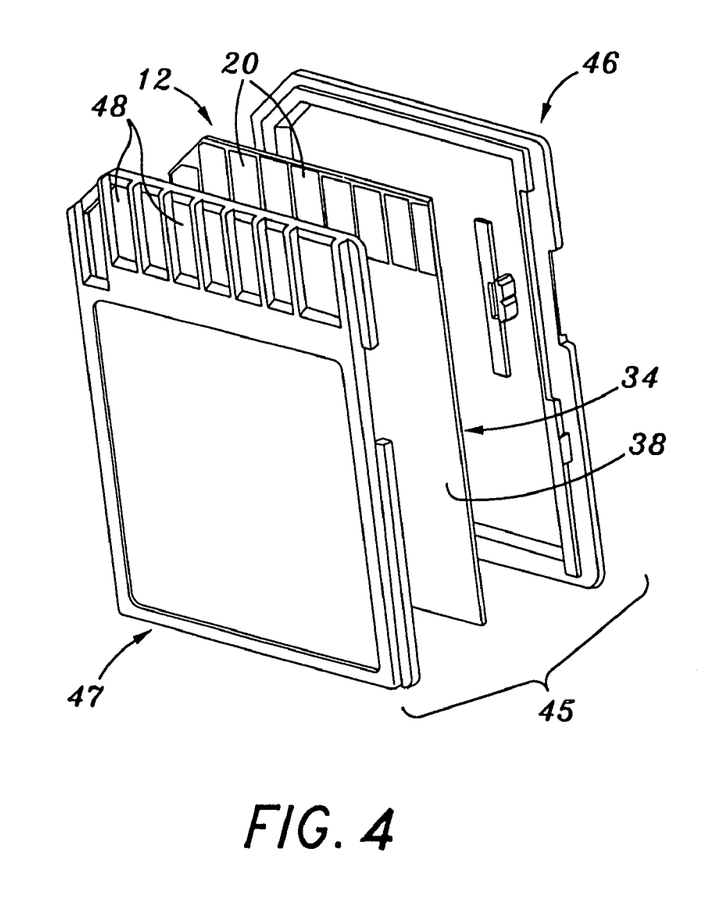
FIG. 4 is an exploded view of a memory card which is constructed in accordance with a second embodiment of the present invention and has a secure digital card form factor.

As indicated above, the memory card 10 has the form factor of a multi-media card. As also indicated above, the circuit module 12 may be employed in memory card format other than a multi-media card format. For example, as shown in FIG. 4, the circuit module 12 can be incorporated into a secure digital card 45 constructed in accordance with a second embodiment of the present invention. In the secure digital card format, first and second skins 46, 47 are included, with the first, top skin 46 being attached to the circuit module 12 and covering approximately the upper half thereof, and the second, bottom skin 47 also being attached to the circuit module 12 and covering approximately the lower half thereof. The top and bottom skins 46, 47 are typically ultrasonically welded or otherwise adhered to each other, with the top skin 46 covering the top surface 36 of the body 34 and the bottom skin 47 covering the bottom surface 38 of the body 34. The bottom skin 47 is formed to include one or more windows 48 which are adapted to expose the bottom surfaces of the contacts 20 within the secure digital card 45. As will be recognized, the bottom surfaces of the contacts 20 within the secure digital card 45 are typically plated with a conductive material (e.g., NiAu, NiPd, etc.) of sufficient thickness as is needed to effectively place such contacts 20 into a flush relationship with the outer surface of the bottom skin 47 to facilitate the electrical connection of the secure digital card 45 to another device.

Figure 5:
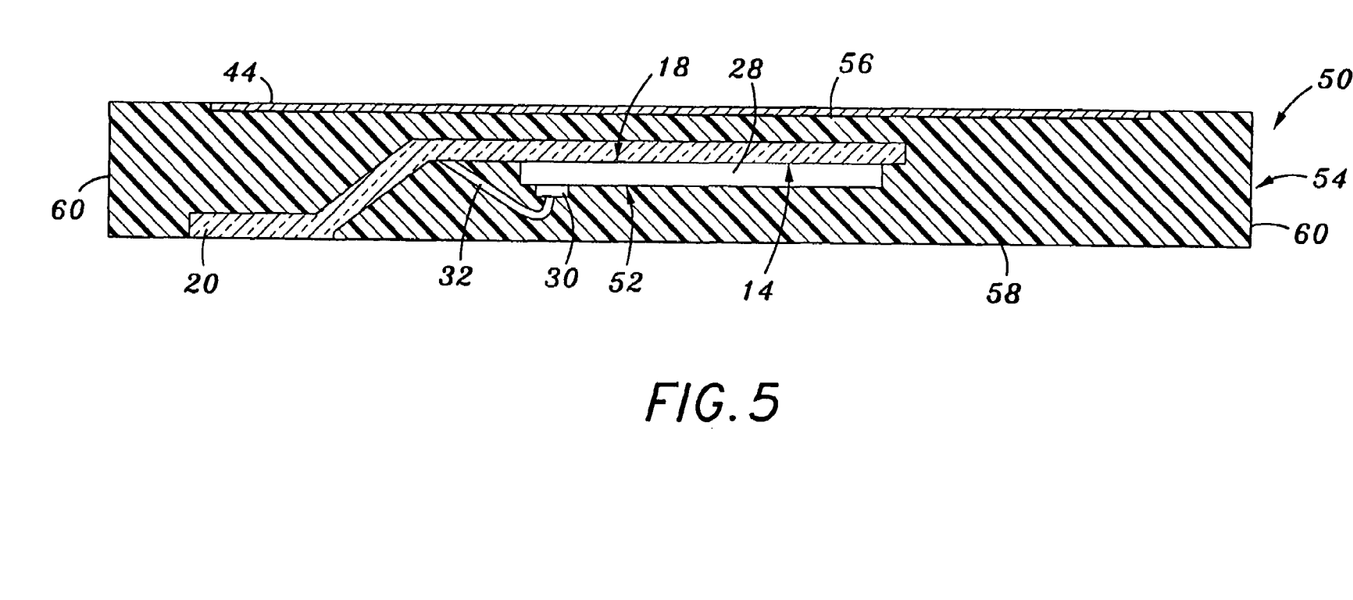
FIG. 5 is a cross-sectional view of a memory card which is constructed in accordance with a third embodiment of the present invention and has a multi-media card form factor.

Referring now to FIG. 5, there is shown a memory card 50 constructed in accordance with a third embodiment of the present invention. Like the memory card 10, the memory card 50 has a form factor particularly suited for use in a multi-media card memory application. The memory card 50 includes a circuit module 52 comprising the above-described leadframe 14, semiconductor die 28, and conductive wires 32. In the circuit module 52, the leadframe 14 is bent in the same manner described above in relation to the circuit module 12. However, the circuit module 52 of the memory card 50 does not include the above-described body 34. In this regard, in the memory card 50 of the second embodiment, an encapsulant material is applied to the circuit module 52 (i.e., the leadframe 14, semiconductor die 28, and conductive wires 32), with the hardening of the encapsulant material forming a body 54 of the memory card 50. Importantly, the body 54 is formed to provide a form factor equivalent to that collectively defined by the body 34 and skin 42 in the memory card 10 of the first embodiment. The body 54 defines a generally planar top surface 56, an opposed, generally planar bottom surface 58, and side surfaces 60 which extend generally perpendicularly between the top and bottom surfaces 56, 58. In the completed body 54, the bottom surfaces of the contacts 20 of the leadframe 14 are exposed within and generally flush with the bottom surface 58 of the body 54. However, in contrast to the body 34 described above, the body 54 of the memory card 50 is formed such that the top surface of the die pad 18 is not exposed within the top surface 56 of the body 54. Rather, the top surface of the die pad 18 is covered with a layer of the encapsulant material, and thus disposed within the body 54. As will be recognized, the top surface of the die pad 18 within the memory card 50 must necessarily be covered or encapsulated by the body 54 due to the absence of any skins within the memory card 50. Subsequent to the formation of the body 54, the leadframe 14 of the circuit module 52 is singulated as needed to facilitate the electrical isolation of the traces 22 and hence the contacts 20 of the leadframe 14 from each other. As in the circuit module 12, the body 54 is formed such that the dambar 16 of the leadframe 14 is exposed, thus allowing for the removal of the same from the memory card 50.

Insert molding using plastic molding processing techniques to facilitate the encapsulation of the circuit module 12, 52 or any other memory module may be used to produce a media card in any form factor. In the case of insert molding a media card, a module (e.g., the circuit module 12, 52) is first placed into a mold cavity shape for a certain form factor. The mold is then closed onto the module, with a polymeric material then being injected around the module. The polymeric matrix resin could be a thermoplastic, rubber, thermoset or any combination of these materials. Possible form factors include memory and I/O cards, including multimedia cards, secure digital cards, thin secure digital cards, compact flash cards, and other small form factor media cards. The plastic processing techniques that could be employed in relation to the formation of the body 34, 54 include injection molding, resin transfer molding, infusion molding, reaction injection molding, and each of their variations. As indicated above, these processes can be used in conjunction with the insertion of a module into a mold to facilitate the manufacture of media cards with the least amount of downstream automated handling. The end product of the process involving the encapsulation of the module inserted into the mold is a plastic surrounded electronics module having a certain form factor.

As also indicated above, this particular manufacturing solution can be used to alleviate the need for a separate lid or skin joined to a body through the use of an adhesive. Since all that is needed is for a module to be placed into a mold of a plastic injection machine, the solution bypasses the automation that is currently used to assemble the individual components of the lid or skin, adhesive and module. With regard to the particular form factors, a secure digital card not requiring an operable switch could be plastic injection molded in one step with a faux switch or with the proper gap allowing the right mode of the electronic switch to become enabled. A secure digital card requiring a movable switch can be manufactured by including clippable-switch mating features on the fully molded card. The clip attachment of the movable switch would occur subsequent to the manufacture of the fully molded secure digital card including the switch mating details.

As indicated above, problems associated with chipping in the body 34, 54 or mold gate pull-out are alleviated through the implementation of the insert molding technique described above in relation to the memory cards 10, 50. Also addressed are the problems of the exposure of the die pad within the memory card attributable to the die pad either being covered by a skin (in the case of the memory card 10) or covered by the body itself (in the case of the memory card 50). Any flash on the exposed bottom surfaces of the contacts in the memory cards 10, 50 is preferably removed via a chemical de-flash process as also indicated above. Those of ordinary skill in the art will recognize that the molding techniques as described above may have utility outside of use in conjunction with the circuit modules 12, 52. In this regard, the molding techniques are independent of substrate technology, and could be used in conjunction with laminates or ceramics provided that a mold is created which fulfills final form factor requirements.

Additional modifications and improvements of the present invention may also be apparent to those of ordinary skill in the art. Thus, the particular combination of parts and steps described and illustrated herein is intended to represent only certain embodiments of the present invention, and is not intended to serve as limitations of alternative devices within the spirit and scope of the invention.

What is claimed is:

1. A memory card comprising:
    a leadframe having:
        at least one die pad; and
        a plurality of contacts;
        the leadframe being configured such that the die pad and the contacts extend along respective ones of spaced, generally parallel frame planes;
    a semiconductor die attached to the die pad such that the semiconductor die extends along a die plane which is disposed between and generally parallel to the frame planes, the semiconductor die being electrically connected to the leadframe; and
    a body at least partially encapsulating the leadframe and the semiconductor die such that the contacts are exposed in a bottom surface defined by the body.

2. The memory card of claim 1 wherein the leadframe further includes a plurality of conductive traces which extend from respective ones of the contacts toward the die pad.

3. The memory card of claim 2 wherein each of the traces defines a sloped portion extending between the die pad and the contacts.

4. The memory card of claim 2 wherein a plurality of conductive wires is used to, electrically connect the semiconductor die to respective ones of the traces.

5. The memory card of claim 4 wherein:
    each of the traces includes a bond pad formed thereon; and the conductive wires are used to electrically connect the semiconductor die to respective ones of the bond pads.

6. The memory card of claim 1 wherein:
the die pad defines opposed, generally planar top and bottom surfaces;
each of the contacts defines opposed, generally planar top and bottom surfaces;
the semiconductor die is attached to the bottom surface of the die pad; and
the bottom surfaces of the contacts are exposed in the bottom surface of the body.

7. The memory card of claim 1 wherein:
the package body defines a top surface having a recess formed therein; and
a label is attached to the package body and disposed within the recess.

8. The memory card of claim 1 wherein:
the package body defines a side surface; and
the contacts are disposed in spaced relation to the side surface.

9. A method of fabricating a memory card, comprising the steps of:
a) providing a leadframe having at least one die pad and a plurality of contacts wherein the die pad and the contacts extend along respective ones of spaced, generally parallel frame planes;
b) attaching a semiconductor die to the die pad such that the semiconductor die extends along a die plane which is disposed between and generally parallel to the frame planes;
c) electrically connecting the semiconductor die to the leadframe; and
d) partially encapsulating the leadframe and the semiconductor die with a body such that the contacts are exposed in a bottom surface defined by the body.

10. The method of claim 9 wherein step (a) comprises providing a leadframe wherein a plurality of conductive traces extends from respective ones of the contacts toward the die pad.

11. The method of claim 10 wherein step (a) comprises providing a leadframe wherein each of the traces is bent to define a sloped portion extending between the die pad and the contacts.

12. The method of claim 10 wherein step (c) comprises electrically connecting the semiconductor die to respective ones of the traces through the use of a plurality of conductive wires.

13. The method of claim 12 wherein:
step (a) comprises providing a leadframe wherein each of the traces includes a bond pad formed thereon; and
step (c) comprises electrically connecting the semiconductor die to respective ones of the bond pads through the use of the conductive wires.

14. The method of claim 9 wherein:
step (a) comprises providing a leadframe wherein the die pad defines opposed, generally planar top and bottom surfaces and each of the contacts defines opposed, generally planar top and bottom surfaces;
step (b) comprises attaching the semiconductor die to the bottom surface of the die pad; and
step (d) comprises forming the body such that the bottom surfaces of the contacts are exposed in the bottom surface thereof.

15. The method of claim 9 wherein:
step (a) comprises providing a leadframe wherein each of the contacts is connected to a dambar of the leadframe; and
step (d) comprises forming the body such that the dambar protrudes therefrom.

16. The method of claim 15 further comprising the step of:
e) removing the dambar from the leadframe to facilitate the electrical isolation of the contacts from each other.

17. The method of claim 9 wherein step (d) is completed through the implementation of a molding process selected from the group consisting of:
injection molding;
resin transfer molding;
infusion molding; and
reaction injection molding.

18. The method of claim 9 wherein step (d) comprises forming the body to have a form factor selected from the group consisting of:
a multi-media card form factor;
a secure digital card form factor; and
a compact flash card form factor.

19. The method of claim 9 wherein step (d) comprises forming the body such that the contacts are disposed in spaced relation to a side surface defined by the body.

20. The method of claim 9 wherein:
step (d) comprises forming the body to include a top surface having a recess formed therein; and
the method further comprises the step (e) of attaching a label to the body within the recess.

* * * * *